(12) United States Patent
Li et al.

(10) Patent No.: US 12,292,480 B2
(45) Date of Patent: May 6, 2025

(54) CONTROLLER AND METHOD FOR DETECTING BATTERY CELL VOLTAGE

(71) Applicant: O2Micro, Inc., Santa Clara, CA (US)

(72) Inventors: Yan Li, Wuhan (CN); Hui Liu, Wuhan (CN); Guoxing Li, Sunnyvale, CA (US)

(73) Assignee: O2Micro, Inc., Sunnyvale, CA (US)

( * ) Notice: Subject to any disclaimer, the term of this patent is extended or adjusted under 35 U.S.C. 154(b) by 51 days.

(21) Appl. No.: 17/368,637

(22) Filed: Jul. 6, 2021

(65) Prior Publication Data

US 2022/0120819 A1 Apr. 21, 2022

(30) Foreign Application Priority Data

Oct. 16, 2020 (CN) .......................... 202011107626.4

(51) Int. Cl.
*G01R 31/3835* (2019.01)
(52) U.S. Cl.
CPC ............................... *G01R 31/3835* (2019.01)
(58) Field of Classification Search
CPC .................................................. G01R 31/3835
See application file for complete search history.

(56) References Cited

U.S. PATENT DOCUMENTS

| 6,556,020 | B1 * | 4/2003 | McCabe | .............. | G01R 31/389 |
| | | | | | 324/426 |
| 10,128,548 | B2 | 11/2018 | Suzuki | | |
| 2006/0186894 | A1 | 8/2006 | Iwabuchi et al. | | |
| 2008/0100266 | A1 | 5/2008 | Sobue | | |
| 2009/0140743 | A1 * | 6/2009 | Ohnuki | ................ | G01R 31/396 |
| | | | | | 324/426 |
| 2009/0179650 | A1 * | 7/2009 | Omagari | ................. | B60L 58/14 |
| | | | | | 324/433 |
| 2009/0195213 | A1 * | 8/2009 | Li | ......................... | H02J 7/0016 |
| | | | | | 320/136 |
| 2009/0295396 | A1 | 12/2009 | Kouchi et al. | | |
| 2010/0173183 | A1 | 7/2010 | Kadirvel et al. | | |
| 2010/0237872 | A1 * | 9/2010 | Kang | .................. | H01M 10/482 |
| | | | | | 324/429 |
| 2010/0289497 | A1 | 11/2010 | Lum-Shue-Chan et al. | | |

(Continued)

FOREIGN PATENT DOCUMENTS

| CN | 100463435 | C | 2/2009 | | |
| CN | 103765721 | | * 4/2014 | .............. | B60L 50/16 |

(Continued)

*Primary Examiner* — Alexander Satanovsky
*Assistant Examiner* — Sharah Zaab (57) ABSTRACT

A controller for detecting voltages of battery cells in a battery pack includes converters coupled to the battery cells and switching units. An anode of each battery cell is coupled to a respective converter through a respective first path, and a cathode of each battery cell is coupled to the respective converter through a respective second path. The switching units are coupled between the battery cells and the converters. The converters are coupled to anodes of the battery cells through the switching units. When a switching unit corresponding to a battery cell is turned on, an anode of the battery cell provides an operating current and a sampling current through a respective first path to a respective converter, and the operating current flows from the anode of the battery cell through the respective converter to ground.

26 Claims, 9 Drawing Sheets

(56) References Cited

U.S. PATENT DOCUMENTS

| | | | | |
|---|---|---|---|---|
| 2011/0140649 A1* | 6/2011 | Choi | ................... | H02J 7/35 |
| | | | | 320/112 |
| 2012/0139548 A1* | 6/2012 | Yang | ................... | H02J 7/0048 |
| | | | | 327/419 |
| 2013/0214789 A1 | 8/2013 | Tang et al. | | |
| 2015/0015209 A1 | 1/2015 | Li et al. | | |
| 2016/0146895 A1* | 5/2016 | Yazami | ................. | H01M 10/48 |
| | | | | 324/426 |
| 2021/0109133 A1 | 4/2021 | Shimamoto et al. | | |
| 2022/0283244 A1* | 9/2022 | Honda | ................ | H01M 10/425 |

FOREIGN PATENT DOCUMENTS

| | | | | | |
|---|---|---|---|---|---|
| CN | 104678160 A | | 6/2015 | | |
| JP | 2001056350 A | | 2/2001 | | |
| KR | 20140106070 | * | 9/2014 | ............ | G01R 31/36 |
| WO | 2019208172 A1 | | 10/2019 | | |
| WO | WO2021060769 | * | 4/2021 | ............ | G01R 19/12 |

* cited by examiner

USThe application claims priority to Chinese Patent Application No. 202011107626.4, titled "Controller and Method for Detecting Battery Cell Voltage," filed on Oct. 16, 2020, with the National Intellectual Property Administration of the People's Republic of China (CNIPA).

CONTROLLER AND METHOD FOR DETECTING BATTERY CELL VOLTAGE

RELATED APPLICATION

This application claims priority to Chinese Patent Application No. 202011107626.4, titled "Controller and Method for Detecting Battery Cell Voltage," filed on Oct. 16, 2020, with the National Intellectual Property Administration of the People's Republic of China (CNIPA).

BACKGROUND

In recent years, batteries have been widely used in power tools, electric bicycles, electric vehicles, military equipment, aerospace and other fields. A voltage of a battery cell represents a potential difference between an anode and a cathode of the battery cell and is one of the important indicators to measure the charge and discharge performance of the battery.

Figure 1:
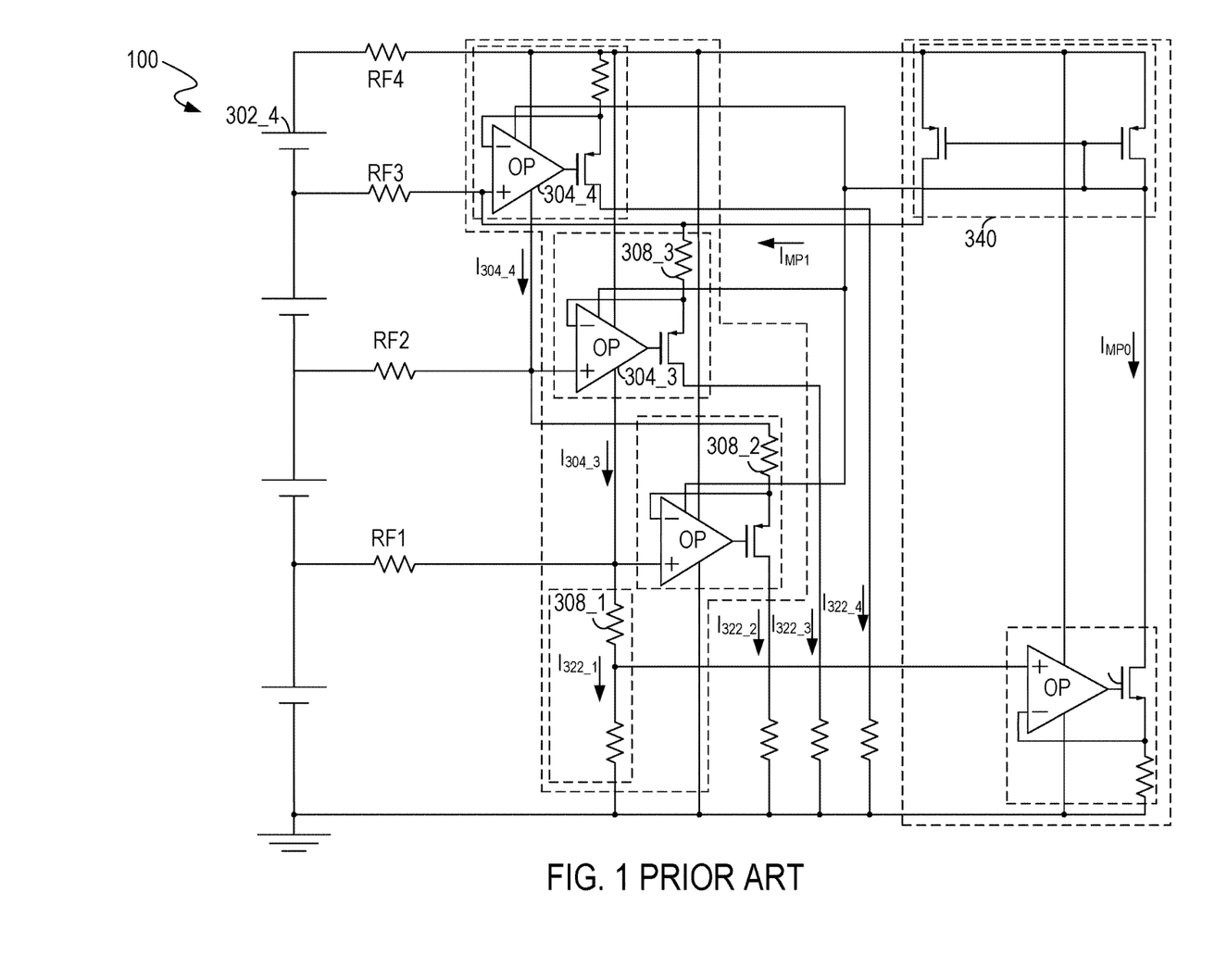
FIG. 1 shows a circuit diagram of a conventional battery voltage detection system.

FIG. 1 is a circuit diagram of a conventional battery voltage detection system 100. The conversion system 100 uses a compensation current $I_{MP1}$ generated by a current mirror 340 to compensate the sampling current $I_{322\_3}$ flowing from a resistor RF3 to a resistor 308_3, uses an operating current $I_{304\_4}$ of the operational amplifier 304_4 to compensate the sampling current $I_{322\_2}$ flowing from a resistor RF2 to a resistor 308_2, and uses an operating current $I_{304\_3}$ of the operational amplifier 304_3 to compensate the sampling current $I_{322\_1}$ flowing from a resistor RF1 to a resistor 308_1. In an ideal state, the currents flowing through the resistors RF3, RF2 and RF1 are all zero due to the compensation. However, since the current flowing through the resistor RF4 is relatively large, the voltage drop generated on the resistor RF4 is also relatively large, resulting in a low accuracy of the detected voltage $V_{302\_4}$ of the battery cell 302_4 which is indicated by the sampling current $I_{322\_4}$.

SUMMARY

Disclosed are embodiments of methods for detecting voltages of battery cells in a battery pack. The battery cells correspond to respective converters, an anode of each battery cell is coupled to a respective converter through a respective first path, a cathode of each battery cell is coupled to the respective converter through a respective second path, and the converters are coupled to anodes of the battery cells through switching units. The method includes: turning on a switching unit corresponding to a battery cell to enable an anode of the battery cell to provide an operating current and a sampling current through a respective first path to a respective converter, where the operating current flows from the anode of the battery cell through the respective converter to ground; and detecting a voltage of the battery cell by a respective converter.

In other embodiments, a controller for detecting voltages of battery cells in a battery pack includes converters coupled to the battery cells and switching units, where an anode of each battery cell is coupled to a respective converter through a respective first path, a cathode of each battery cell is coupled to the respective converter through a respective second path. The switching units are coupled between the battery cells and the converters. The converters are coupled to anodes of the battery cells through the switching units. When a switching unit corresponding to a battery cell is turned on, an anode of the battery cell provides an operating current and a sampling current through a respective first path to a respective converter, where the operating current flows from the anode of the battery cell through the respective converter to ground.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in combination with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail to avoid obscuring aspects of the present invention.

Figure 2:
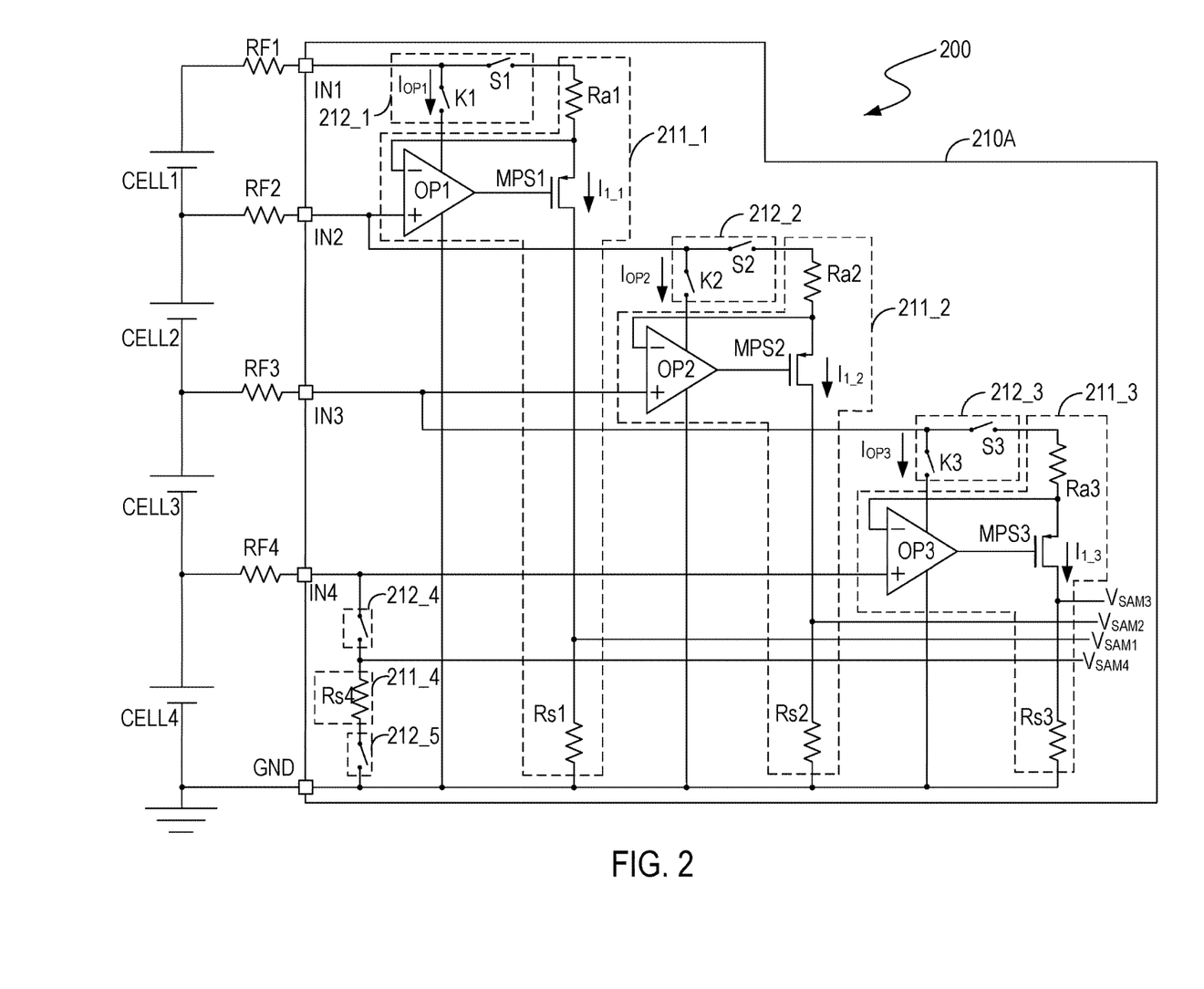
FIG. 2 shows a circuit diagram of a controller, in accordance with embodiments of the present invention.

FIG. 2 shows a circuit diagram 200 of a controller 210A for detecting voltages of battery cells in a battery pack, in accordance with embodiments of the present invention. The example battery pack in FIG. 2 includes battery cells CELL1, CELL2, CELL3, and CELL4, and the controller 210A includes converters 211_1-211_4 corresponding to the battery cells CELL1-CELL4, respectively. In this embodiment, the battery cell CELL1 is called the top battery cell (i.e., the battery farthest from the reference ground GND), and the battery cell CELL4 is called the bottom battery cell (i.e., the battery closest to the reference ground GND).

The anode of the battery cell CELLj (j=1, 2, or 3) is coupled to the converter 211_j through a first path, and the cathode of the battery cell CELLj is coupled to the converter 211_j through a second path. The controller 210A further includes switching units 212_1-212_4 coupled between the battery cells CELL1-CELL4 and the converters 211_1-211_4, respectively. The converters 211_1-211_4 are coupled to anodes of the battery cells CELL1-CELL4 through the switching units 212_1-212_4, respectively. When a corresponding switching unit of each battery cell is turned on, an operating current $I_{OPj}$ and a sampling current $I_{1\_j}$ provided by the anode of the battery cell CELLj flow through a first path corresponding to the converter 211_j. The operating current $I_{OPj}$ flows from the anode of the battery cell CELLj through the first path and the corresponding converter 211J to ground. An operating current $I_{OP(j+1)}$ and a sampling current $I_{1\_(j+1)}$ provided by the anode of the battery cell CELL(j+1) flow through a second path corresponding to the converter 211_j. In an embodiment, the first path corresponding to the converter 211_j includes a connecting resistor RFj. The second path corresponding to the converter 211_j includes a connecting resistor RF(+1). For the battery cell CELL4, the anode of the battery cell CELL4 is coupled to the converter 211_4 via the connecting resistor RF4 and the switching unit 212_4, and the cathode of the battery cell CELL4 is coupled to the converter 211_4 via the switching unit 212_5. In one embodiment, the resistance of the connecting resistors RF1, RF2, RF3, and RF4 are equal.

The converter 211_j can be enabled or disabled by turning on or turning off the switching unit 212_j 0=1, 2, or 3). For example, by turning on the switching unit 212_1 (e.g., switches S1 and K1), the converter 211_1 is enabled, and by turning off the switching unit 212_1, the converter 211_1 is disabled. In an embodiment, the switching unit 212_j (j=1, 2, or 3) includes a switch Sj and a switch Kj. By turning on the switch Kj, the anode of the battery cell CELLj provides the converter 211_j with the operating current $I_{OPj}$ through the first path corresponding to the converter 211_j. By controlling the switch Kj, the operational amplifier OPj in the converter 211_j can be enabled or disabled individually to save power. By turning on the switch Sj, the anode of the battery cell CELLj provides the sampling current $I_{1\_j}$ to the converter 211_j through the first path corresponding to the converter 211_j.

In addition, when the switching units 212_4 and 212_5 are on at the same time, the converter 211_4 is enabled, and by turning off any one of the switching units 212_4 and 212_5, the converter 211_4 is disabled. When the switching units 212_4 and 212_5 are on at the same time, the sampling current $I_{1\_4}$ (not shown in the figure) and the operating current $I_{OP4}$ (not shown in the figure) provided by the anode of the cell CELL4 flow through the converter 211_4.

The converter 211_j detects the voltage of the cell CELLj and generates a sampling signal SAMj (j=1, 2, 3, or 4). In an embodiment, the sampling signal SAMj can be a sampling current $I_{1\_j}$. Specifically, the converter 211_j converts the voltage of the cell CELLj to the sampling current $I_{1\_j}$, thereby indicating the voltage of the cell CELLj. In another embodiment, the sampling signal SAMj can be a sampling voltage $V_{SAMj}$. Specifically, the sampling current $I_{1\_j}$ (j=1, 2, 3, or 4) flows through the sampling resistor Rsj and is detected as the sampling voltage $V_{SAMj}$. In an embodiment, the sampling voltages $V_{SAMj}$ (j=1, 2, 3, 4) are all based on the same reference voltage (for example, ground).

In an embodiment, the converter 211_j (j=1, 2, or 3) includes an operational amplifier OPj, a resistor Raj, a transistor MPSj, and a sampling resistor Rsj. The operational amplifier OPj (0=1, 2, or 3) is coupled to the anode of the battery cell CELLj through the switch Kj, and the operating current IOPj flows from the anode of the battery cell CELLj to the ground via the connecting resistor RFj and the operational amplifier OPj. The resistor Raj is coupled to the anode of the cell CELLj through the switch Sj, and the sampling current $I_{1\_j}$ flows from the anode of the cell CELLj to the ground via the connecting resistor RFj, the resistor Raj, and the sampling resistor Rsj. The converter 211-4 includes a sampling resistor Rs4. The operating modes of the controller 210A in FIG. 2 can include the following two modes.

In a first operating mode, the controller 210A turns on all the switching units 212_1-212_4 in FIG. 2, so that the converters 211_1-211_4 are all enabled. The converter 211_j (j=1, 2, or 3) receives the operating current $I_{1\_(j+1)}$ and the sampling current $I_{1\_j}$ provided by the cell CELLj through the first path corresponding to the converter 211_j. The operating current $I_{OP(j+1)}$ and the sampling current $I_{1\_(j+1)}$ provided by the lower cell CELL(j+1) adjacent to the cell CELLj flow through the second path corresponding to the converter 211_j. In an embodiment, in an ideal state, by property setting the parameters of related components, the sum of the operating current and the sampling current provided by each battery cell can be approximately equal. The converter 211_j detects the voltage of the battery cell CELLj, and generates a sampling signal SAMj (for example, the sampling voltage $V_{SAMj}$ or the sampling current $I_{1\_j}$) indicating the voltage of the battery cell CELLj.

In addition, when detecting the voltage of the battery cell CELL4, the battery cell CELL4, the connecting resistor RF4, and the converter 211_4 constitute a closed loop. The converter 211-4 detects the voltage of the battery cell CELL4 and generates a sampling signal SAM4 (e.g., the current flowing through the converter 211_4 or the voltage on the converter 211-4) indicating the voltage of the battery cell CELL4.

Compared to FIG. 1, the controller 210A in FIG. 2 changes the power supply method for the operational amplifier in each converter so that the current flowing through the first path and the current flowing through the second path corresponding to each converter both are the sum of the operating current and sampling current provided by the anodes of the two adjacent battery cells. In an ideal state, by properly setting the parameters of the relevant components, the operating current of each operational amplifier can be approximately equal, and each sampling current can be approximately equal. In an embodiment, since the resistances of the connecting resistors are set to be equal, with the above conditions, the voltage drop on each connecting resistor is also approximately equal. Therefore, compared with the system in FIG. 1, the controller 210A can detect the voltage of each battery cell more accurately. However, since the anode of each battery cell provides the operating current and sampling current for the corresponding converter, the current flowing through the battery cells CELL1, CELL2, CELL3, and CELL4 increases in sequence. After the controller 210A operates for a relatively long time, the balance between the voltages of the individual cells may be lost (balance means that the voltage differences of the individual cells are within an acceptable range), which would reduce the accuracy of the detected voltage of each cell represented by each sampling signal. To address this, the present invention includes a second operating mode of the controller 210A.

In the second operating mode, the controller 210A selectively turns on the switching units (for example, the switching units 212j, 212_(j+1)) corresponding to two adjacent battery cells (for example, battery cells CELLj, CELL(j+1), j=1, 2, 3) to enable two adjacent converters (e.g., converters 211_j, 211_(j+1)) while other converters remain disabled.

An upper converter (e.g., the converter 211_j) of the two adjacent converters (e.g. converters 211_j, 211_(j+1), j=1, 2, 3) receives an operating current $I_{OPj}$ and a sampling current $I_{1\_j}$ from an anode of an upper cell (e.g., CELLj) of two adjacent cells through a first path corresponding to the upper converter. An operating current $I_{OP(j+1)}$ and a sampling current $I_{1\_(j+1)}$ from an anode of a lower cell (e.g., CELL (j+1)) of the two adjacent cells flows through a second path corresponding to the upper converter (e.g. the converter 211_j). The upper converter (e.g. the converter 211_j) detects a voltage of the upper cell (e.g., CELLj).

To detect the voltage of CELL4, the controller 210A can turn on both switching units 212_4 and 212_5, or can turn on switching unit 212_4 and turn off switching unit 212_5. Both methods can enable the controller 210A to accurately detect a voltage of the battery cell CELL4.

In the second operating mode, by controlling the duty cycle of the on-time of the switching units corresponding to the two adjacent battery cells, an average value of the difference between the currents flowing through each battery cell can be reduced, thereby maintaining balance among battery cells. The duty cycle refers to the ratio of the on-time t of the switching units corresponding to the two adjacent battery cells to the detection period T. The detection period T refers to the total time required to detect the voltages of all the battery cells CELL1, CELL2, CELL3, and CELL4. The details will be described in FIG. 3.

Figure 3:
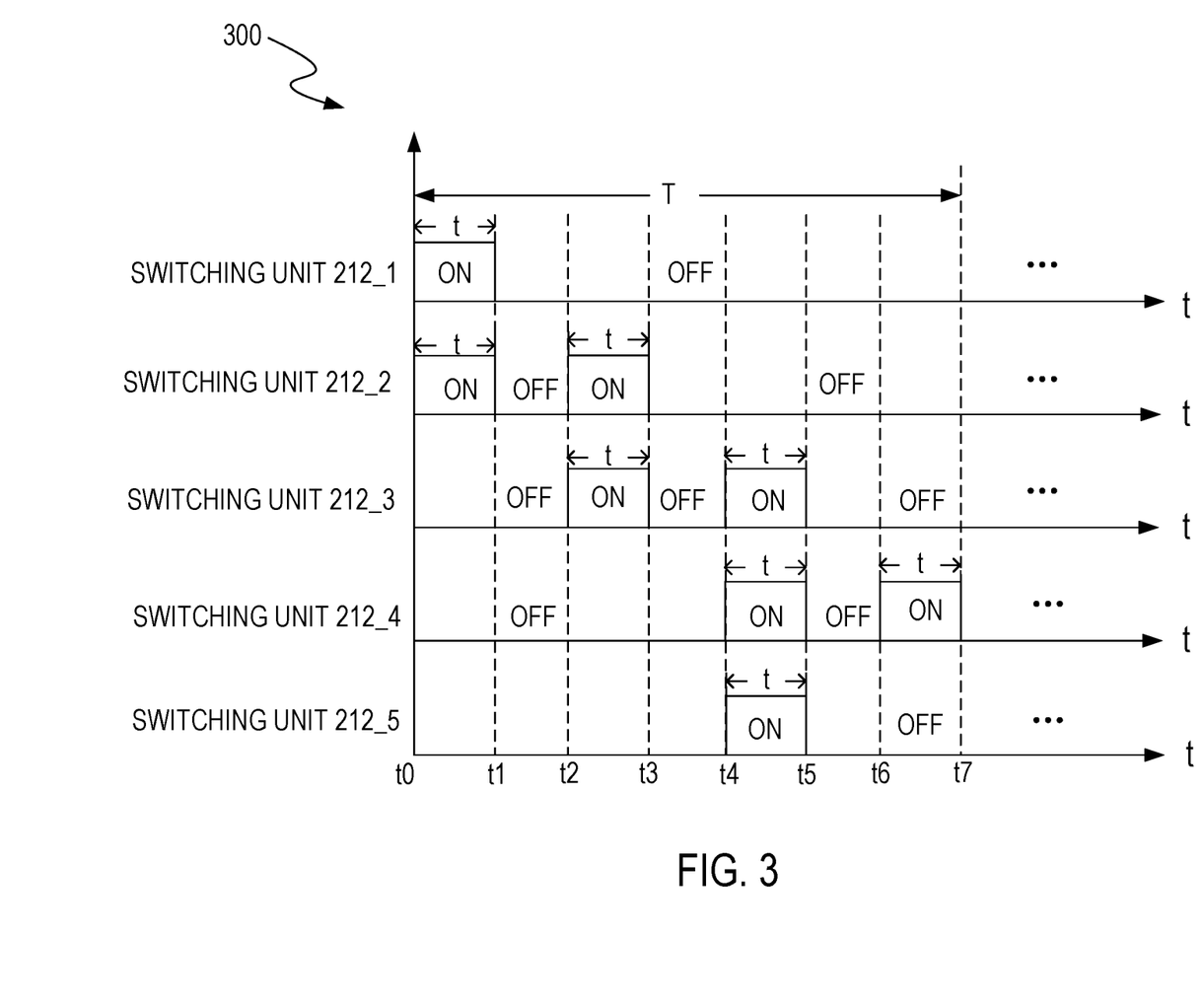
FIG. 3 shows a timing diagram of multiple switching units in a controller, in accordance with embodiments of the present invention.

FIG. 3 shows a timing diagram of the switching units in controller 210A operating in the second mode, in accordance with embodiments of the present invention. In the embodiment shown in FIG. 3, during the time period from t0 to t1, only the switching units 212_1 and 212_2 are turned on, and the converter 211_1 detects the voltage of the cell CELL1. During the time period from t2 to t3, only the switching units 212_2 and 212_3 are turned on, and the converter 211_2 detects the voltage of the cell CELL2. In the time period from t4 to t5, only the switching units 212_3, 212_4, and 212_5 are turned on, and the converter 211_3 detects the voltage of the cell CELL3. During the time period from t6 to t7, only the switching unit 212_4 is turned on, and the converter 211_4 detects the voltage of the cell CELL4. In this embodiment, t1−t0 t3−t2=t5−t4=t7−t6. In other embodiments, t1−t0, t3−t2, t5−t4, and t7−t6 may not be equal.

Assume, for example, that the detection period T in FIG. 3 is 100 ms, and the on-time t of the switching units corresponding to two adjacent battery cells are both 100 µs, in which case the duty cycle is 100 µs/100 ms. Assume also that the current received by each converter through a corresponding first path is 10 µA. In this example, when the controller 210A operates in the first mode, the difference between the current flowing through the battery cell CELL1 and the current flowing through the battery cell CELL3 is 20 µA. When the controller 210A operates in the manner shown in FIG. 3 (second mode), during the detection period T, the average value of the difference between the current flowing through the cell CELL1 and the current flowing through the cell CELL3 is reduced to 20 nA in this example. It can be seen that by controlling (for example, reducing) the duty cycle of the on-time t of the switching units corresponding to two adjacent battery cells as in the second mode, the average value of the difference between the currents flowing through the battery cells can be reduced, thereby maintaining balance among battery cells.

Figure 4:
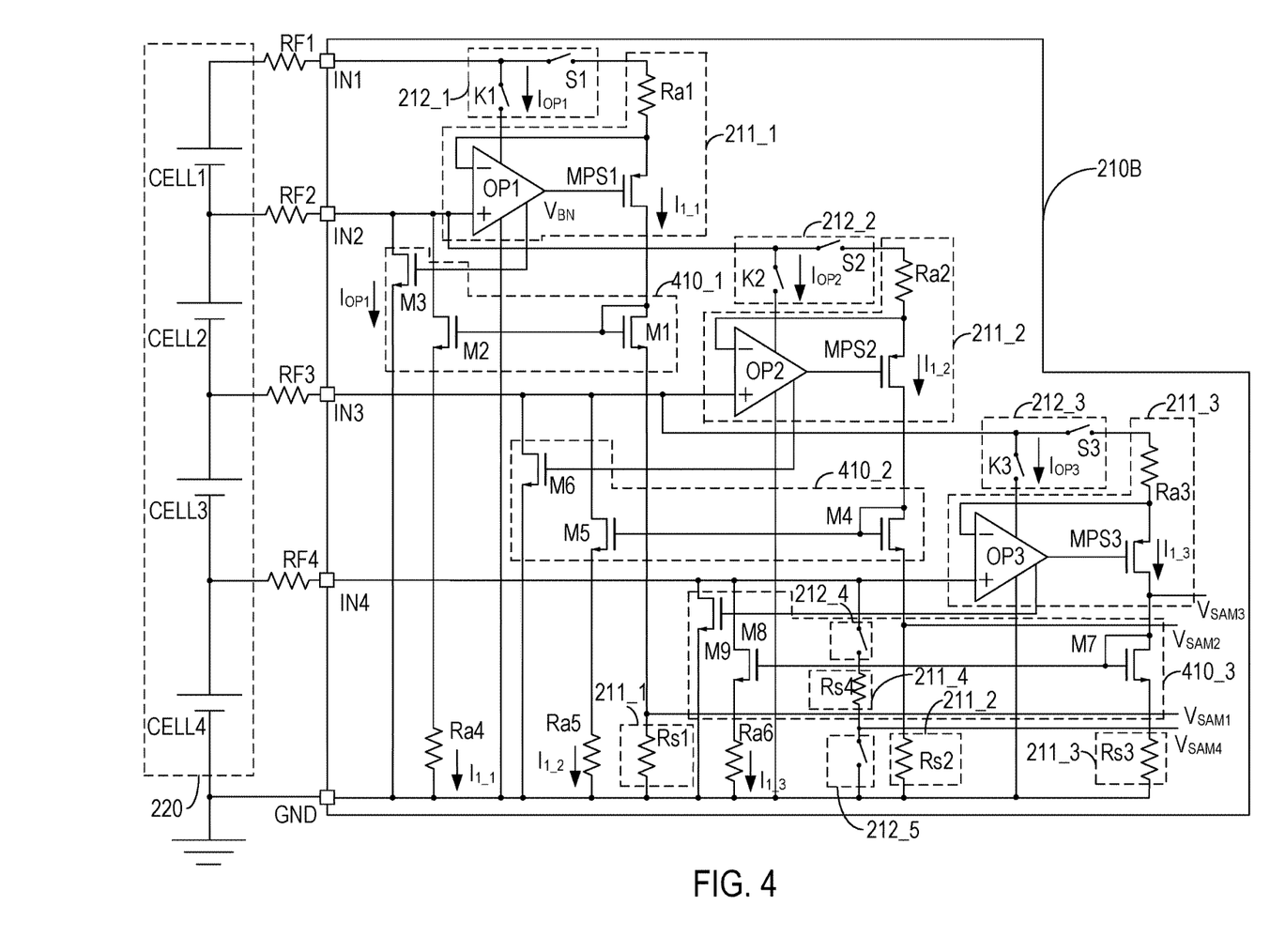
FIG. 4 shows a circuit diagram of a controller, in accordance with embodiments of the present invention.

FIG. 4 shows a circuit diagram of a controller 210B, in accordance with embodiments of the present invention.

Compared with the controller 210B in FIG. 2, the controller 210B further includes multiple mirroring unit. In the example of FIG. 4, the controller 210B includes mirroring unit 410_1, 410_2 and 410_3.

The mirroring unit 410_j (j=1, 2, or 3) duplicates the operating current $I_{OPj}$ and the sampling current $I_{1\_j}$ of the converter 211_j corresponding to the battery cell CELLj, so as to reduce the difference between the current through the first path corresponding to the converter 211_j and the current through the second path corresponding to the converter 211_j. The mirroring unit 410_j is coupled to the second path corresponding to the converter 211_j.

Specifically, the mirroring unit 410_j (j=1, 2, or 3) generates a first duplicated current proportional to the operating current $I_{OPj}$. In an embodiment, in an ideal state, the first duplicated current can be approximately equal to the operating current $I_{OPj}$ by properly setting parameters of the relevant components. The mirroring unit 410_j (=1, 2, or 3) generates a second duplicated current proportional to the sampling current $I_{1\_j}$. In an embodiment, in an ideal state, the second duplicated current can be approximately equal to the sampling current $I_{1\_j}$ by properly setting the parameters of the relevant components. The operating current $I_{OPj}$ and the sampling current $I_{1\_j}$ flow through the first path corresponding to the converter 211_j. The first duplicated current and the second duplicated current flow through the second path corresponding to the converter 211_j.

In an embodiment, each mirroring unit includes a first branch, a second branch, and a third branch. The sampling current ij flows through the first branch coupled to the converter 211_j (j=1, 2, or 3). The second branch coupled to the first branch generates a first duplicated current proportional to the sampling current $I_{1\_j}$. The first duplicated current flows from the second path corresponding to the converter 211_j to the second branch. The third branch coupled to the converter 211_j generates a second duplicated current proportional to the operating current $I_{OPj}$. The second duplicated current flows from the second path corresponding to the converter 211_j to the third branch.

In the embodiment shown in FIG. 4, the mirroring unit 410_1 includes a first branch, a second branch, and a third branch. The first branch includes a transistor M1, the second branch includes a transistor M2, and the third branch includes a transistor M3. The gate of the transistor M1 is coupled to the gate of the transistor M2 to constitute a current mirror structure, and the gate of the transistor M3 is coupled to components related to the operating current $I_{OP1}$ inside the operational amplifier OP1 to constitute a current mirror structure. The sampling current $I_{1\_1}$ flows to the ground via the transistor M1. The transistor M2 duplicates the sampling current $I_{1\_1}$ flowing through the transistor M1 to generate a first duplicated current. The first duplicated current flows to the transistor M2 via the second path corresponding to the converter 211_1. The transistor M3 duplicates the operating current $I_{OP1}$ of the converter 211_1 to generate a second duplicated current. The second duplicated current flows to the transistor M3 via the second path corresponding to the converter 211_1. In the FIG. 4 embodiments, the structures of the mirroring unit 410_2 and 410_3 are the same as that of the mirroring unit 410_1.

In operation, the controller 210B in FIG. 4 selectively turns on the switching unit 212_j corresponding to the battery cell CELLj (j=1, 2, or 3), the converter 211_j corresponding to the battery cell CELLj is enabled, and other converters are disabled. The mirroring unit 410_j corresponding to the battery cell CELLj is enabled to duplicate the current flowing through the first path corresponding to the converter 211_j. The voltage of the cell CELLj is detected by the converter 211_j.

For example, to detect the voltage of the cell CELL1, the switches S1 and K1 are turned on, and the converter 211_1 and the mirroring unit 410_1 are enabled. The mirroring unit 410_1 duplicates the current through the first path corresponding to the converter 211_1 to the second path corresponding to the converter 211_1. In an ideal state, with the duplicated current produced by the mirroring unit 410_1, the current through the first path corresponding to the converter 211_1 is approximately equal to the current through the second path corresponding to the converter 211_1. The converter 211_1 detects the voltage of the cell CELL1 and generates a sampling signal SAM1 indicating the voltage of the cell CELL1.

The process of detecting the voltages of the battery cell CELL2 and CELL3 is similar to that of detecting the voltage of the battery cell CELL1. The process of detecting the voltage of the battery cell CELL4 is similar to that described with FIG. 2.

According to the above description, by using the mirroring units, the current through the first path corresponding to the converter 211_i (i=1, 2, or 3) can be approximately equal to the current through the second path corresponding to the converter 211_i, so that the sampling signal can accurately indicate the voltage of the corresponding cell. Furthermore, by controlling (for example, reducing) the duty cycle of the on-time t of the switching unit corresponding to each battery cell, an average value of the differences between currents flowing through the battery cells can be reduced, thereby maintaining balance among the cells. The duty cycle refers to the ratio of the on-time t of each switching unit to the detection period T.

Figure 5:
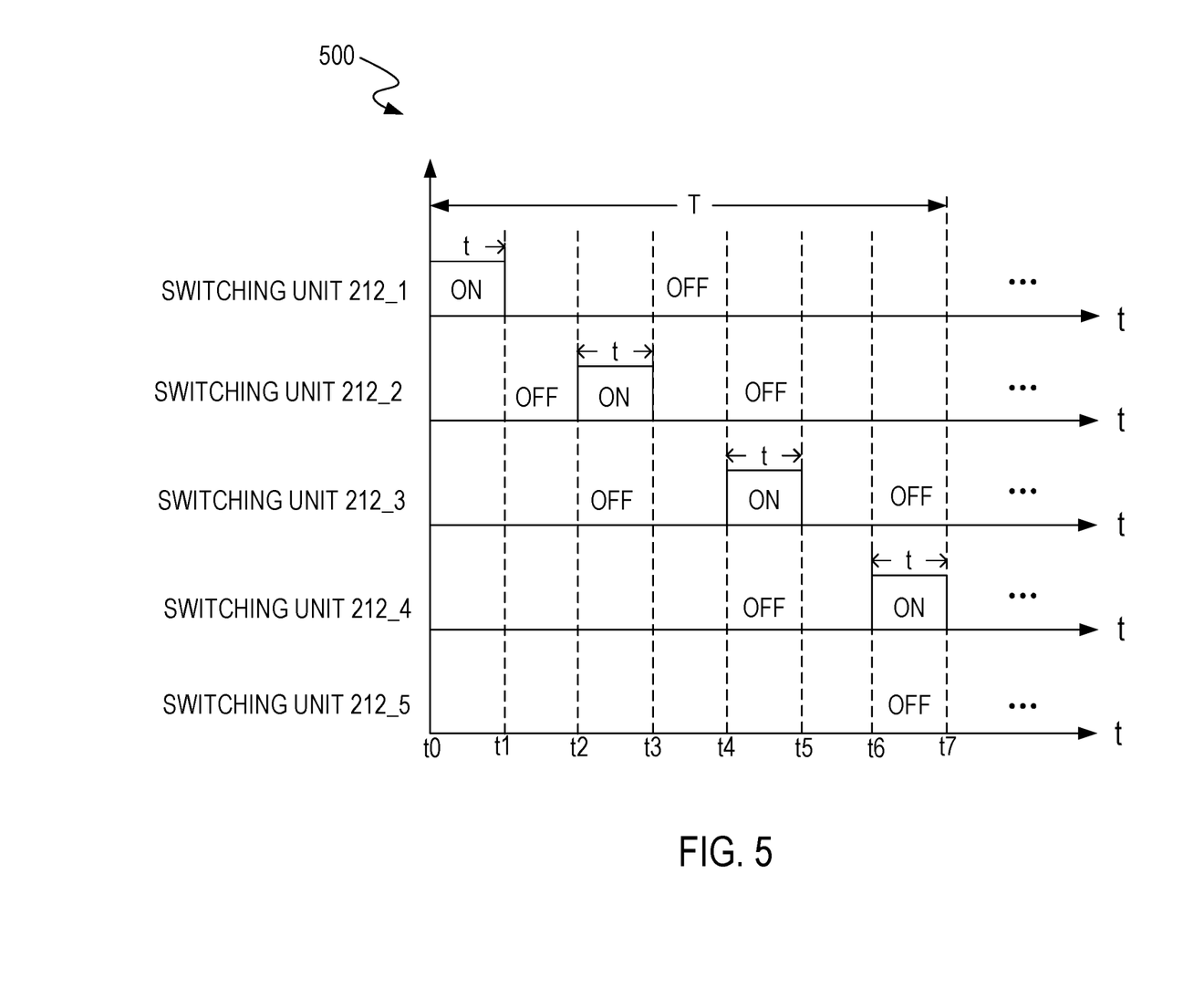
FIG. 5 shows a timing diagram of multiple switching units in a controller, in accordance with embodiments of the present invention.

FIG. 5 shows a timing diagram of the switching units in the controller 210B in FIG. 4. In the embodiment shown in FIG. 5, during the time period from t0 to t1, only the switching unit 212_1 is turned on, and the converter 211_1 detects the voltage of the cell CELL1. In the time period from t2 to t3, only the switching unit 212_2 is turned on, and the converter 211_2 detects the voltage of the cell CELL2. In the time period from t4 to t5, only the switching unit 212_3 is turned on, and the converter 211_3 detects the voltage of the cell CELL3. During the time period from t6 to 7, only the switching unit 212_4 is turned on, and the converter 211_4 detects the voltage of the cell CELL4. In this embodiment, t1−t0=t3−t2=t5−t4=t7−t6. In other embodiments, t1−t0, t3−t2, t5−t4, and t7−t6 may not be equal.

By controlling (for example, reducing) the duty cycle of the on-time t of each switching unit, an average value of the difference between the current flowing through each battery cell can be reduced, thereby maintaining balance among the cells.

Figure 6:
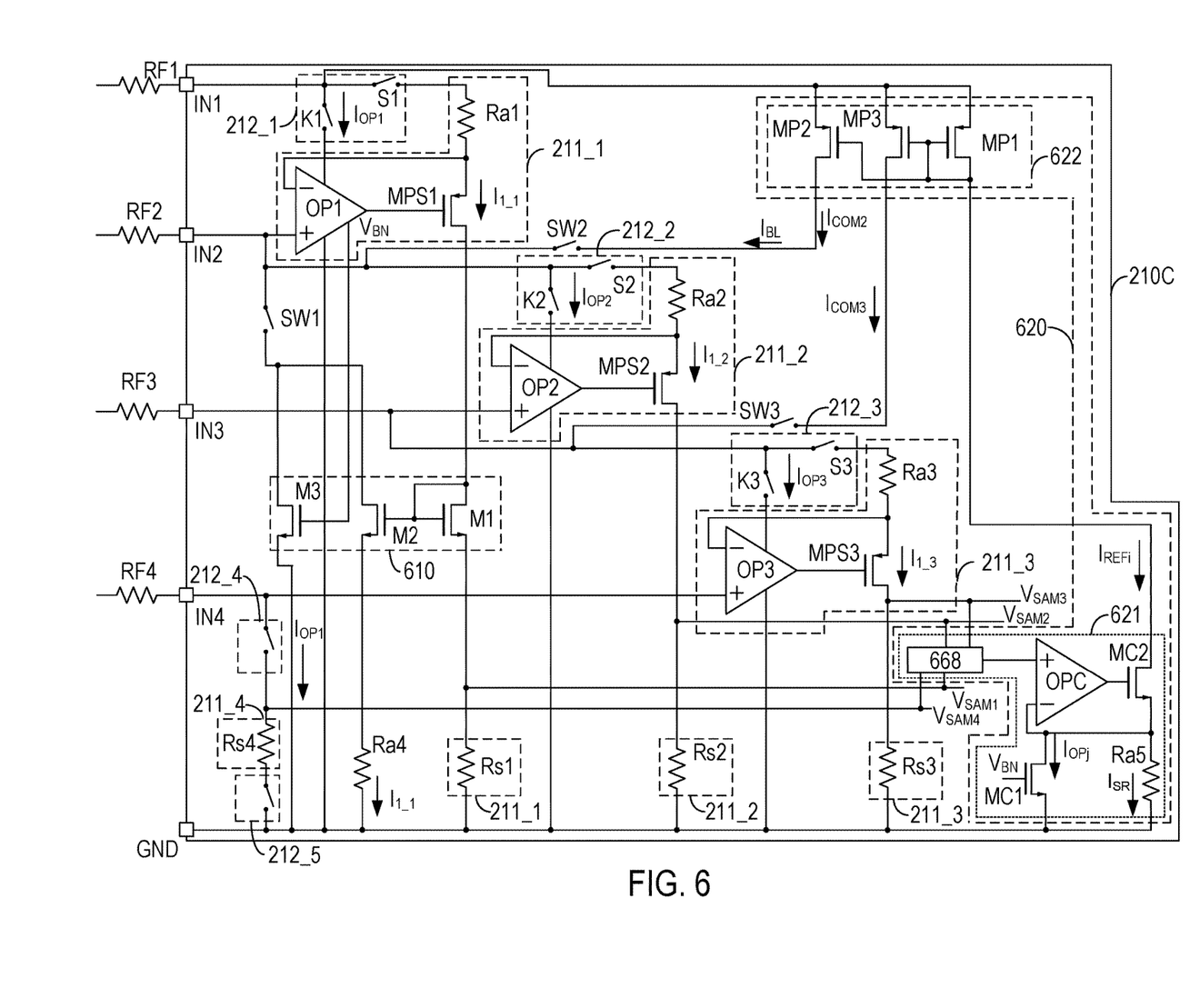
FIG. 6 shows a circuit diagram of a controller, in accordance with embodiments of the present invention.

FIG. 6 shows a circuit diagram of a controller 210C in accordance with embodiments of the present invention.

Compared with the controller 210A in FIG. 2, the controller 210C shown in FIG. 6 further includes a mirroring unit 610 and a compensation circuit 620.

The mirroring unit 610 is coupled to the second path corresponding to the top cell CELL1, and is operable for duplicating the operating current $I_{OP1}$ and the sampling current $I_{1\_1}$ of the converter 211_1 corresponding to the top battery cell, to reduce the difference between the current flowing through the first path corresponding to the converter 211_1 and the current flowing through the second path corresponding to the converter 211_1.

Specifically, to detect the voltage of the cell CELL1, the switching unit 212_1 and the switch SW1 are turned on, and the converter 211_1 and the mirroring unit 610 are enabled. The operating current $I_{OP1}$ and the sampling current $I_{1\_1}$ provided by the anode of the battery cell CELL1 flow through the first path corresponding to the converter 211_1. The mirroring unit 610 duplicates the current flowing through the first path corresponding to the converter 211_1 to the second path corresponding to the converter 211_1, thereby reducing the difference between the current flowing through the first path corresponding to the converter 211_1 and the current flowing through the second path corresponding to the converter 211_1. In an embodiment, in an ideal state, by property setting the parameters of related components and by using the mirroring unit 610, the current flowing through the first path corresponding to the converter 211_1 is approximately equal to the current flowing through the second path corresponding to the converter 211_1. Therefore, the converter 211_1 can accurately detect the voltage of the battery cell CELL1.

The compensation circuit 620 is coupled to converters 211_1-211_4, and is operable for generating one or more compensation currents to compensate the currents of the first paths corresponding to one or more cells. The one or more battery cells can be battery cells other than the top battery cell (for example, battery cells CELL2 and CELL3).

Specifically, to detect the voltage of the battery cell CELLj (j=2 or 3), the switching unit 212j and the switch SWj are turned on, and the converter 211_j and the compensation circuit 620 are enabled. The converter 211J receives the operating current $I_{OPj}$ and the sampling current $I_{1\_j}$ provided by the cell CELLj through the first path corresponding to the converter 211_j. The compensation circuit 620 generates a compensation current $I_{COMj}$ according to the operating current $I_{OPj}$ and the sampling current $I_{1\_j}$ to compensate the current flowing through the first path corresponding to the battery cell CELLj.

In an embodiment, the compensation circuit 620 includes a detection unit 621 coupled to the multiple converters, and a compensation unit 622 coupled to the detection unit 621. The detection unit 621 samples the operating current and the sampling current of the converters, and generates a respective reference current proportional to a sum of the operating current and the sampling current.

Specifically, to detect the voltage of the battery cell CELLj (=2 or 3), the switching unit 212_j is turned on, the converter 211_j is enabled, and the anode of the battery cell CELLj provides the operating current $I_{OPj}$ and sampling current $I_{1\_j}$ to the converter 211_j through the corresponding first path. The switch SWj is turned on, and the detection unit 621 samples the operating current $I_{OPj}$ and the sampling current $I_{1\_j}$, and generates a reference current $I_{REFj}$ that is proportional to the sum of the operating current $I_{OPj}$ and the sampling current $I_{1\_j}$.

In an embodiment, the detection unit 621 includes a selector 668, an operational amplifier OPC, a transistor MC1, a resistor Ra5, and a transistor MC2. The selector 668 is operable for selecting one sampling signal $V_{SAMi}$ from among multiple sampling signals. In an embodiment, the sampling signal $V_{SAMi}$ selected by the selector 668 is the sampling voltage corresponding to the battery cell CELLj. The transistor MC1 is respectively coupled to components related to the operating current $I_{OPj}$ in the operational amplifier OPj (j=1, 2, or 3) to constitute a current mirror that is operable for duplicating the operating current $I_{OPj}$ of the operational amplifier OPj. The sampling voltage $V_{SAMi}$ selected by the selector 668 is applied to the resistor Ra5 to generate a current $I_{SR}$. The sum of the operating current $I_{OPj}$ and the current $I_{SR}$ is the reference current $I_{REFi}$. The reference current $I_{REFi}$ flows through the transistor MC2 to ground. In an ideal state, by properly setting the parameters of related components, the current $I_{SR}$ can be approximately equal to the sampling current $I_{1\_j}$, and the reference current $I_{REFi}$ can be proportional to the sum of the operating current $I_{OPj}$ and the current $I_{SR}$.

The compensation unit 622 generates a compensation current $I_{COMj}$ that is proportional to the reference current $I_{REFj}$ (j=2 or 3). The compensation current $I_{COMj}$ compensates the current flowing through the first path corresponding to the battery cell CELLj.

Specifically, the compensation unit 622 duplicates the reference current $I_{REFj}$ (j=2 or 3) to generate the compensation current $I_{COMj}$. When the switch SWj is turned on, the compensation current $I_{COMj}$ flows from the compensation unit 622 to the first path corresponding to the battery cell CELLj. In an ideal state, by properly setting the parameters of the relevant components, the magnitude of the compensation current $I_{COMj}$ (j=2 or 3) is approximately equal to the sum of the operating current $I_{OPj}$ and the sampling current $I_{1\_j}$, such that the overall current flowing through the first path corresponding to the converter 211_j is equal to zero. Meanwhile, since the switching unit 212_(+1) is turned off, the current flowing through the second path corresponding to the converter 211_j is also zero. Because the current flowing through the first path corresponding to the converter 211_j and the current flowing through the second path corresponding to the converter 211_j are both zero, the converter 211_j can accurately detect the voltage of the battery cell CELLj.

In an embodiment, the compensation unit 622 includes transistors MP1, MP2, and MP3. The transistor MP1 and the transistors MP2 and MP3 constitute a current mirror that is operable for duplicating the reference current $I_{REFj}$ flowing through the transistor MP1 to generate a corresponding compensation current $I_{COMj}$. When the switch SWj (j=2 or 3) is turned on, the compensation current $I_{COMj}$ flows from the compensation unit 622 to the first path corresponding to the converter 211_j, so that the overall current flowing through the first path corresponding to the converter 211_j is approximately equal to zero.

According to the above description, the converters can accurately detect the voltage of each battery cell. However, when detecting the voltage of the battery cell CELL1, the duplicated current generated by the mirroring unit 610 flows from a node between the cathode of the battery cell CELL1 and the anode of the battery cell CELL2 through the resistor RF2, causing the current flowing through the battery cell CELL1 to be less than the current flowing through other battery cells. This will cause the battery pack to lose its balance. To address this, the compensation circuit 620 in the controller 210C according to an embodiment of the present invention is further operable for generating a balancing current $I_{BL}$. When the switch SW2 is turned on, the balancing current $I_{BL}$ flows from the compensation unit 622 through the second path corresponding to the converter 211_1 to the cathode of the top battery cell CELL1, and further flows to the anode of the top battery cell CELL1 to reduce the difference between the current flowing through the top battery cell and the current flowing through other battery cells, thereby maintaining balance among each cell.

Figure 7:
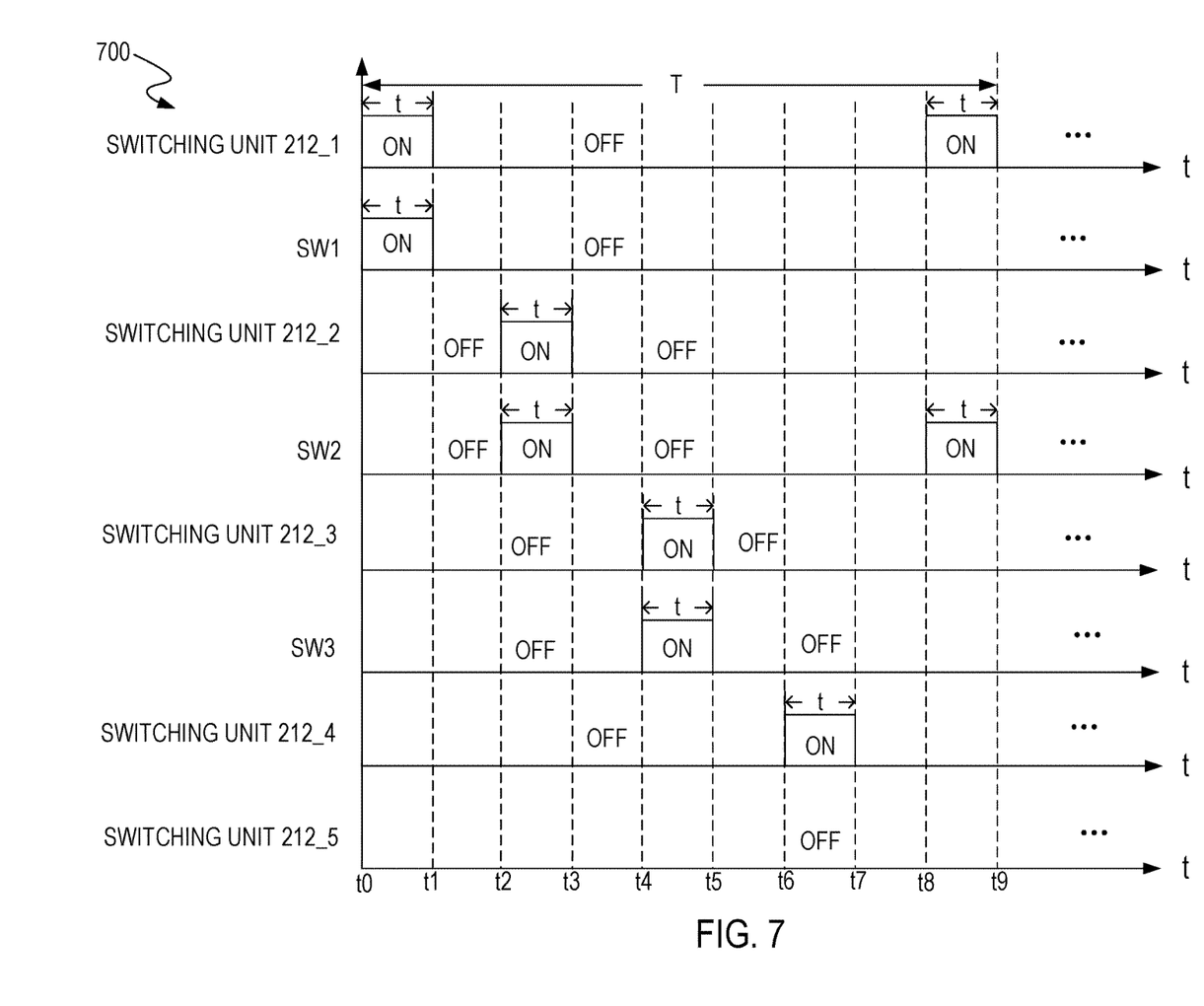
FIG. 7 shows a timing diagram of multiple switching units in a controller, in accordance with embodiments of the present invention.
Figure 8:
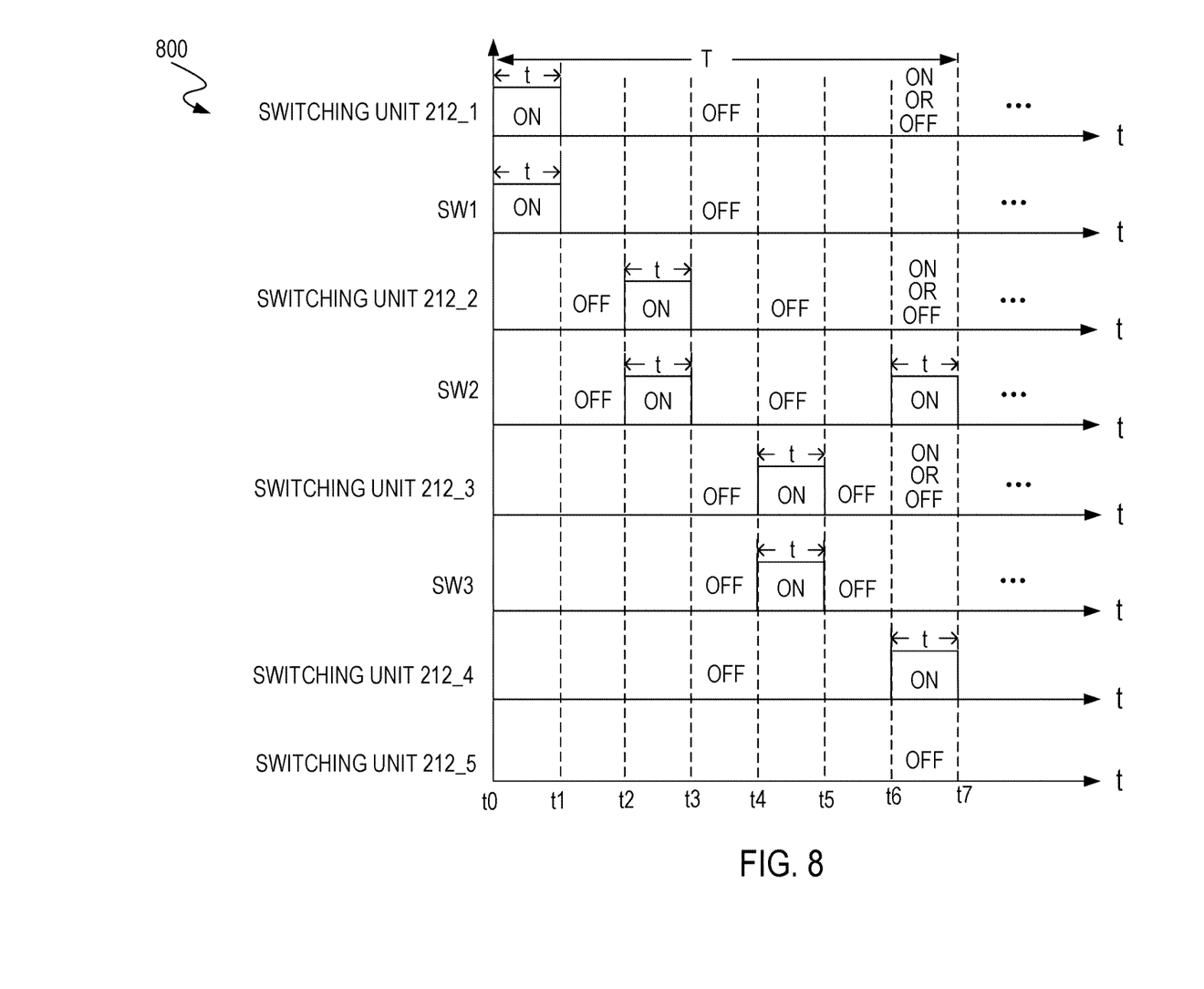
FIG. 8 shows a timing diagram of multiple switching units in a controller, in accordance with embodiments of the present invention.

FIG. 7 and FIG. 8 show timing diagrams associated with the controller 210C. In an embodiment as shown in FIG. 7, in a detection period T, the controller 210C first detects the voltage of each battery cell once (e.g., from CELL1 to CELL4), and then enables the converter 211_1 corresponding to the top battery cell CELL1 again. The compensation circuit 620 generates a balancing current $I_{BL}$ proportional to the sum of the operating current $I_{OP1}$ and the sampling current $I_{1\_1}$ of the converter 211_1. In another embodiment as shown in FIG. 8, when detecting the voltage of the cell CELL1, the compensation circuit 620 generates a balancing current Iet proportional to the sum of the operating current $I_{OPi}$ and the sampling current hi of the converter 211_i corresponding to the cell CELL1. In the example of FIG. 8, CELL1 is CELL4. In other examples, CELL1 may be any battery cell other than the top battery cell CELL1 and the lower battery cell adjacent to the top battery cell (i.e., CELL2). A detailed description is given below.

FIG. 7 shows a timing diagram of multiple switching units in the controller 210C in FIG. 6, in accordance with embodiments of the present invention.

In the time period from t0 to t1, the controller 210C detects the voltage of the battery cell CELL1. The switching unit 212_1 and the switch SW1 are turned on, and the converter 211_1 and the mirroring unit 610 are enabled. The mirroring unit 610 duplicates the current flowing through the first path corresponding to the converter 211_1 to the second path corresponding to the converter 211_1. The converter 211_1 detects the voltage of the cell CELL1 and generates a sampling signal SAM1 indicating the voltage of the cell CELL1. During this time period, there is current flowing through the second path corresponding to the converter 211_1, and thereby the current flowing through the battery cell CELL1 is less than the current flowing through other battery cells.

During the time period from t2 to t3, the controller 210C detects the voltage of the battery cell CELL2, and during the time period from t4 to t5, the controller 210C detects the voltage of the battery cell CELL3. When the voltage of the cell CELLj (j=2 or 3) is detected, only the switching unit 212j and the switch SWj are turned on, and the converter 211_j and the compensation circuit 620 are enabled. The anode of the battery cell CELLj provides the operating current $I_{OP1}$ and the sampling current $I_{1\_j}$ to the converter 211_j through the corresponding first path. The detection unit 621 samples the operating current $I_{OPj}$ and the sampling current $I_{1\_j}$, and generates a reference current $I_{REFj}$ proportional to the sum of the operating current $I_{OPj}$ and the sampling current $I_{1\_j}$. The compensation unit 622 generates a compensation current $I_{COMj}$ according to the reference current $I_{REFj}$. The compensation current $I_{COMj}$ compensates the current through the first path corresponding to the battery cell CELLj. Due to the effect of the compensation current $I_{COMj}$, the current flowing through the first path corresponding to the battery cell CELLj is reduced. In an ideal state, by properly setting the parameters of the relevant components, the compensation current $I_{COMj}$ (=2 or 3) is approximately equal to the sum of the operating current lop, and the sampling current $I_{1\_j}$, so that the overall current flowing through the first path corresponding to the converter 211_j is approximately equal to zero. During this time period, since the switching unit 212_(j+1) is off, the current flowing through the second path corresponding to the converter 211_j is also zero. Therefore, the converter 211_j can accurately detect the voltage of the battery cell CELLj.

During the time period from t6 to t7, the controller 210C detects the voltage of the battery cell CELL4. The process of detecting the voltage of the battery cell CELL4 is similar to that described with FIG. 2.

During the time period from t8 to t9, the controller 210C compensates the current consumed by the cell CELL1. The switching unit 212_1 and the switch SW2 are turned on again, and the converter 211_1 and the compensation circuit 620 are enabled. The anode of the battery cell CELL1 provides the converter 211_1 with the operating current $I_{OP1}$ and the sampling current $I_{1\_1}$. The compensation circuit 620 samples the operating current $I_{OP1}$ and the sampling current $I_{1\_1}$ and generates a balancing current $I_{BL}$ that is proportional to the sum of the operating current $I_{OP1}$ and the sampling current $I_{1\_1}$. The balancing current $I_{BL}$ flows from the cathode of the battery cell CELL1 to the anode of the battery cell CELL1. In this example, the balancing current $I_{BL}$ only increases the current flowing through the battery cell CELL1. In an ideal state, by properly setting the parameters of related components, the balancing current let is approximately equal to the sum of the operating current $I_{OP1}$ and the sampling current $I_{1\_1}$. This method can accurately compensate the reduced current consumed by the battery cell CELL1.

In this embodiment, t1−t0=t3−t2=t5−t4=t7−t6=t9−t8. In other embodiments, t1−t0, t3−t2, t5−t4, t7−t6, and t9−t8 may not be equal.

FIG. 8 shows another timing diagram of multiple switching units in the controller 210C in FIG. 6, in accordance with embodiments of the present invention. In the time period from time t0 to 16, the process of detecting the voltages of the battery cells CELL1. CELL2, and CELL3 is similar to that described with FIG. 7.

In the time period from t6 to t7, the controller 210C detects the voltage of the battery cell CELL4. The switching unit 212_4 is turned on and the switching unit 212_5 is turned off. The converter 211_4 detects the voltage of the cell CELL4 and generates a sampling voltage $V_{SAM4}$ indicating the voltage of the cell CELL4. The compensation circuit 620 turns on any one of the switching units 212_1-212_3, samples the operating current of the operational amplifier corresponding to the turned-on switching unit, and samples the sampling voltage $V_{SAM4}$ to generate a balancing current $I_{BL}$. The balancing current $I_{BL}$ flows from the cathode of the battery cell CELL1 to the anode of the battery cell CELL1. In this example, the balancing current $I_{BL}$ only increases the current flowing through the battery cell CELL1. This method can compensate the reduced current consumed by the battery cell CELL1 while detecting the voltage of the battery cell CELL4, thus saving time and reducing power consumption.

In this embodiment, t1−t=t3−t2=t5−t4=t7−t6. In other embodiments, t1−t0, t3−t2, t5−t4, and t7−t6 may not be equal. In the example of FIG. 8, when the voltage of the battery cell CELL4 is detected, the compensation circuit 620 generates a balancing current $I_{BL}$. In other examples, when detecting other battery cells (e.g., CELL3), the compensation circuit 620 generates a balancing current $I_{BL}$ according to the operating current and sampling voltage of the operational amplifier corresponding to the battery cell being detected.

In the embodiments shown in FIG. 7 and FIG. 8, the compensation current generated by the compensation circuit 620 makes the overall current through the first path corresponding to the converters 211-2 and 211-3 approximately equal to zero, and the balancing current generated by the compensation circuit 620 makes the current flowing through cell CELL1 during detecting period T is approximately equal to the current flowing through other cells. Therefore, while enabling each converter to accurately detect the voltage of each battery cell, it also maintains balance between current flowing through each battery cell so that the life span of the battery pack is not shortened.

Figure 9:
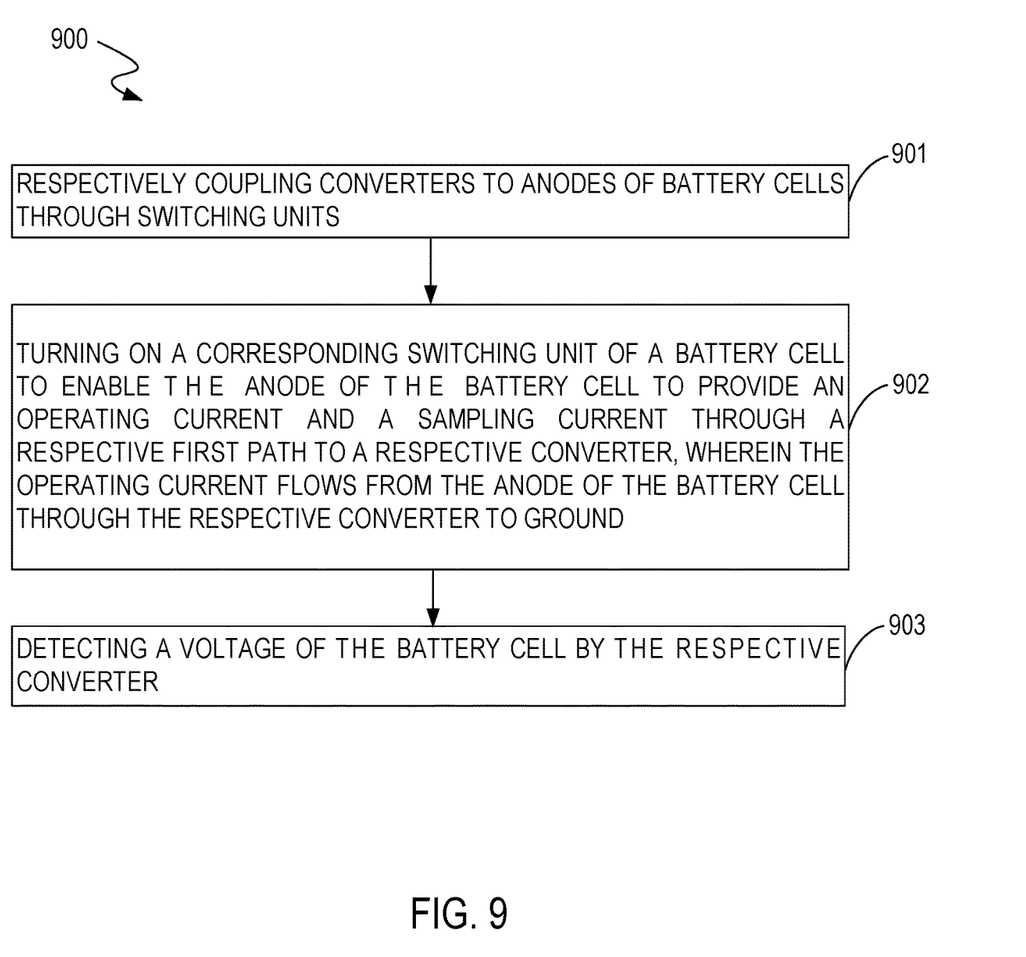
FIG. 9 shows a flowchart of a method for detecting battery cell voltages, in accordance with embodiments of the present invention.

FIG. 9 shows a flowchart 900 of a method for detecting battery cell voltages, in accordance with embodiments of the present invention.

In block 901, converters are respectively coupled to anodes of battery cells through switching units.

In block 902, a corresponding switching unit of a battery cell is turned on to enable the anode of a battery cell to provide an operating current and sampling current to a respective converter through a respective first path for the battery cell. The operating current flows from the anode of the battery cell through the respective converter to ground.

In block 903, the respective converter detects a voltage of the battery cell.

As described above, the present invention discloses a controller and a method for detecting battery cell voltages. The embodiments according to the present invention reduce the difference between the current through a first path coupled between a converter and an anode of a corresponding battery cell and the current through a second path coupled between the converter and a cathode of the corresponding battery cell, thereby enabling the converters to accurately detect the voltage of each battery cell.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A method for detecting voltages of a plurality of battery cells coupled in series in a battery pack by controlling a plurality of switching units and a switch, wherein each battery cell of said plurality of battery cells comprises an anode coupled to a respective converter of a plurality of converters through a respective switching unit of said plurality of switching units and comprises a cathode coupled to said respective converter through a respective path of a plurality of paths, wherein said switch is coupled between a compensation circuit and the respective path for a top battery cell that is at an end of said series of said plurality of battery cells, said method comprising:
performing a first plurality of operations in parallel in a first time period; and
performing a second plurality of operations in parallel in a second time period,
wherein said first plurality of operations comprises:
turning on the respective switching unit for said top battery cell to enable the anode of said top battery cell to provide a first operating current and a first sampling current that flow to ground through the respective switching unit for said top battery cell and the respective converter for said top battery cell;
enabling a first current to flow to said ground from the cathode of said top battery cell through the respective path for said top battery cell; and detecting a voltage of said top battery cell by said respective converter for said top battery cell, and wherein said second plurality of operations comprises:
turning on a first switching unit of said plurality of switching units to enable a second operating current and a second sampling current to flow through said first switching unit;
generating a balancing current by said compensation circuit according to said second operating current and said second sampling current; and
turning on said switch to allow said balancing current to flow from said compensation circuit through said cathode of said top battery cell to said anode of said top battery cell.

2. The method of claim 1, further comprising:
selectively turning on two switching units of said plurality of switching units corresponding to two adjacent battery cells of said plurality of battery cells, to enable two adjacent converters of said plurality of converters that correspond to said two adjacent battery cells while the other converters of said plurality of converters are disabled, wherein an upper converter of said two adjacent converters receives an operating current and a sampling current from an anode of an upper battery cell of said two adjacent battery cells through a switching unit of said two switching units, and wherein an operating current and a sampling current from an anode of a lower battery cell of said two adjacent battery cells flow through the other switching unit of said two switching units; and
detecting a voltage of said upper battery cell by said upper converter.

3. The method of claim 2, further comprising:
controlling duty cycles of said two switching units to decrease an average value of differences between currents through each battery cell of said plurality of battery cells.

4. The method of claim 1, wherein said enabling said first current comprises:
turning on the respective switching unit for a lower battery cell of said plurality of battery cells, said lower battery cell adjacent to said top battery cell, to enable the anode of said lower battery cell to provide a third operating current and a third sampling current that flow through said respective switching unit for said lower battery cell to the respective converter for said lower battery cell, wherein said first current comprises said third operating current and said third sampling current.

5. The method of claim 1, wherein said enabling said first current comprises:
duplicating, by a mirroring unit coupled to said respective path for said top battery cell, said first operating current and said first sampling current, to reduce a difference between a current from said anode of said top battery cell to said respective converter for said top battery cell and a current from said cathode of said battery cell to said respective converter for said top battery cell.

6. The method of claim 5, wherein said duplicating comprises:
generating a first duplicated current according to said first operating current, wherein said first duplicated current is proportional to said first operating current, and wherein said first current comprises said first duplicated current; and
generating a second duplicated current according to said first sampling current, wherein said second duplicated current is proportional to said first sampling current, and wherein said first current further comprises said second duplicated current.

7. The method of claim 6, wherein: said mirroring unit comprises a first branch, a second branch, and a third branch; said first sampling current flows through said first branch; said second branch is operable for generating said first duplicated current; said first duplicated current flows to said second branch from said respective path for said top battery cell; said third branch is operable for generating said second duplicated current; and said second duplicated current flows to said third branch from said respective path for said top battery cell.

8. The method of claim 1, further comprising:
turning on a switching unit of said plurality of switching units that corresponds to a first battery cell of said plurality of battery cells, to enable a first converter of said plurality of converters;
enabling a mirroring unit to duplicate a current from the anode of said first battery cell to said first converter to generate a duplicated current, wherein said duplicated current flows to a branch of said mirroring unit from the respective path for said first battery cell; and
detecting, by said first converter, a voltage of said first battery cell.

9. The method of claim 8, further comprising:
controlling duty cycles of said plurality of switching units to reduce an average value of differences between currents through said plurality of battery cells.

10. The method of claim 1, further comprising performing a third plurality of operations in parallel in a third time period, wherein said third plurality of operations comprises:
turning on the respective switching unit for a lower battery cell of said plurality of battery cells, said lower battery cell adjacent to said top battery cell, to enable a third operating current and a third sampling current to flow through the respective converter for said lower battery cell;
generating a compensation current by said compensation circuit according to said third operating current and said third sampling current;
turning on said switch to allow said compensation current to flow from said compensation circuit to a path between the anode of said lower battery cell and said respective converter for said lower battery cell, thereby compensating said third operating current and said third sampling current; and
detecting a voltage of said lower battery cell by said respective converter for said lower battery cell.

11. The method of claim 10, wherein said compensation circuit comprises a detection unit and a compensation unit, and wherein said generating said compensation current comprises:
sampling, by said detection unit, said third operating current and said third sampling current;
generating, by said detection unit, a reference current proportional to a sum of said third operating current and said third sampling current; and
generating, by said compensation unit, said compensation current proportional to said reference current.

12. The method of claim 1, further comprising:
generating, by said compensation circuit, said balancing current through said cathode of said top battery cell to said anode of said top battery cell, to reduce a difference between a current through said top battery cell and currents through other battery cells of said plurality of battery cells.

13. The method of claim 1, wherein said first switching unit comprises said respective switching unit for said top battery cell, and wherein said second plurality of operations further comprises:

turning on said respective switching unit for said top battery cell to enable said second operating current and said second sampling current to flow through said respective converter for said top battery cell; and controlling, by said compensation circuit, said balancing current to be proportional to a sum of said second operating current and said second sampling current.

14. A controller for detecting voltages of a plurality of battery cells coupled in series in a battery pack, said controller comprising:

a plurality of switching units coupled to said plurality of battery cells;

a plurality of converters coupled to said plurality of battery cells through said plurality of switching units, wherein each battery cell of said plurality of battery cells comprises an anode coupled to a respective converter of said plurality of converters through a respective switching unit of said plurality of switching units and comprises a cathode coupled to said respective converter through a respective path of a plurality of paths; and a compensation circuit coupled to the respective path for a top battery cell of said plurality of battery cells through a switch, wherein said controller is operable for performing a first plurality of operations in parallel in a first time period, said first plurality of operations comprising:

turning on the respective switching unit for said top battery cell to enable the anode of said top battery cell to provide a first operating current and a first sampling current that flow to ground through said respective switching unit for said top battery cell and the respective converter for said top battery cell;

enabling a first current to flow to said ground from the cathode of said top battery cell through said respective path for said top battery cell; and detecting a voltage of said top battery cell by said respective converter for said top battery cell, and wherein said controller is further operable for performing a second plurality of operations in parallel in a second time period, said second plurality of operations comprising:

turning on a first switching unit of said plurality of switching units to enable a second operating current and a second sampling current to flow through said first switching unit;

generating a balancing current by said compensation circuit according to said second operating current and said second sampling current; and turning on said switch to allow said balancing current to flow from said compensation circuit through said cathode of said top battery cell to said anode of said top battery cell.

15. The controller of claim 14, further operable for selectively turning on two switching units of said plurality of switching units corresponding to two adjacent battery cells of said plurality of battery cells, to enable two adjacent converters of said plurality of converters that correspond to said two adjacent battery cells while the other converters of said plurality of converters are disabled, wherein an upper converter of said two adjacent converters receives an operating current and a sampling current from an anode of an upper battery cell of said two adjacent battery cells through a switching unit of said two switching units, and wherein an operating current and a sampling current from an anode of a lower battery cell of said two adjacent battery cells flow through the other switching unit of said two switching units.

16. The controller of claim 15, further operable for controlling duty cycles of said two switching units to decrease an average value of differences between currents through each battery cell of said plurality of battery cells.

17. The controller of claim 14, further operable for turning on the respective switching unit for a lower battery cell of said plurality of battery cells, said lower battery cell adjacent to said top battery cell, to enable the anode of said lower battery cell to provide a third operating current and a third sampling current that flow through said respective switching unit for said lower battery cell to the respective converter for said lower battery cell, wherein said first current comprises said third operating current and said third sampling current.

18. The controller of claim 14, further comprising:

a mirroring unit, coupled to said respective path for said top battery cell, and operable for duplicating said first operating current and said first sampling current, to reduce a difference between a current from said anode of said top battery cell to said respective converter for said top battery cell and a current from said cathode of said battery cell to said respective converter for said top battery cell.

19. The controller of claim 18, wherein said mirroring unit is operable for generating a first duplicated current proportional to said first operating current, and for generating a second duplicated current proportional to said first sampling current, wherein said first current comprises said first duplicated current and said second duplicated current.

20. The controller of claim 19, wherein said mirroring unit comprises a first branch, a second branch, and a third branch, and wherein: said first sampling current flows through said first branch; said second branch is operable for generating said first duplicated current; said first duplicated current flows to said second branch from said respective path for said top battery cell; said third branch is operable for generating said second duplicated current; and said second duplicated current flows to said third branch from said respective path for said top battery cell.

21. The controller of claim 14, further operable for turning on a switching unit of said plurality of switching units that corresponds to a first battery cell of said plurality of battery cells, to enable a first converter of said plurality of converters, and for enabling a mirroring unit to duplicate a current from the anode of said first battery cell to said first converter to generate a duplicated current, wherein said duplicated current flows to a branch of said mirroring unit from the respective path for said first battery cell.

22. The controller of claim 21, further operable for controlling duty cycles of said plurality of switching units to reduce an average value of differences between currents through said plurality of battery cells.

23. The controller of claim 14, further operable for performing a third plurality of operations in parallel in a third time period, wherein said third plurality of operations comprises:

turning on the respective switching unit for a lower battery cell of said plurality of battery cells, said lower battery cell adjacent to said top battery cell, to enable a third operating current and a third sampling current to flow through the respective converter for said lower battery cell;

generating a compensation current by said compensation circuit according to said third operating current and said third sampling current;

turning on said switch to allow said compensation current to flow from said compensation circuit to a path between the anode of said lower battery cell and said respective converter for said lower battery cell, thereby compensating said third operating current and said third sampling current; and detecting a voltage of said lower battery cell by said respective converter for said lower battery cell.

24. The controller of claim 23, wherein said compensation circuit comprises:

a detection unit operable for sampling said third operating current and said third sampling current and generating a reference current proportional to a sum of said third operating current and said third sampling current; and a compensation unit operable for generating said compensation current proportional to said reference current.

25. The controller of claim 14, wherein said compensation circuit is operable for generating said balancing current through a said cathode of said top battery cell to said anode of said top battery cell, to reduce a difference between a current through said top battery cell and currents through other battery cells of said plurality of battery cells.

26. The controller of claim 14, wherein said first switching unit comprises said respective switching unit for said top battery cell, and wherein said second plurality of operations further comprises:

turning on said respective switching unit for said top battery cell to enable said second operating current and said second sampling current to flow through said respective converter for said top battery cell; and controlling said balancing current to be proportional to a sum of said second operating current and said second sampling current.

* * * * *